(12) United States Patent
Munoz-Acevedo et al.

(10) Patent No.: US 10,109,921 B2
(45) Date of Patent: *Oct. 23, 2018

(54) SELF-CALIBRATING ANTENNA SYSTEM

(71) Applicant: Intel IP Corporation, Santa Clara, CA (US)

(72) Inventors: Alfonso Munoz-Acevedo, Neubiberg (DE); Pablo Herrero, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/270,154

(22) Filed: Sep. 20, 2016

(65) Prior Publication Data

US 2017/0054215 A1 Feb. 23, 2017

Related U.S. Application Data

(63) Continuation of application No. 14/138,193, filed on Dec. 23, 2013, now Pat. No. 9,450,687.

(51) Int. Cl.
| | |
|---|---|
| *H04B 17/00* | (2015.01) |
| *H01Q 9/04* | (2006.01) |
| *H03H 7/40* | (2006.01) |
| *H04B 17/12* | (2015.01) |
| *H04B 17/19* | (2015.01) |
| *H01Q 1/24* | (2006.01) |

(52) U.S. Cl.
CPC .......... *H01Q 9/0442* (2013.01); *H01Q 1/242* (2013.01); *H03H 7/40* (2013.01); *H04B 17/12* (2015.01); *H04B 17/19* (2015.01)

(58) Field of Classification Search
USPC .......................... 455/120, 561; 375/347, 232
See application file for complete search history.

(56) References Cited

U.S. PATENT DOCUMENTS

| | | | |
|---|---|---|---|
| 2003/0072363 A1* | 4/2003 | McDonald | H04L 25/0212 375/232 |
| 2005/0117677 A1* | 6/2005 | Sampath | H04L 1/06 375/347 |
| 2011/0086600 A1* | 4/2011 | Muhammad | H04B 1/0458 455/120 |
| 2011/0170463 A1* | 7/2011 | Aryan | G01S 13/74 370/281 |
| 2013/0079060 A1* | 3/2013 | Pivit | H01Q 3/267 455/561 |

* cited by examiner

*Primary Examiner* — Ganiyu A Hanidu
(74) *Attorney, Agent, or Firm* — Schiff Hardin LLP

(57) ABSTRACT

A self-calibrating antenna system having a radio frequency (RF) detector configured to estimate a time delay of a transmission signal on a transmission line, which couples an RF front end with an antenna tuner, based on a magnitude and phase of an input impedance of the transmission line at a first set of a plurality of respective frequencies, and a transceiver configured to transmit to the antenna tuner a calibrated tuning control command based on the estimated time delay to calibrate the antenna tuner and the transmission line.

21 Claims, 3 Drawing Sheets

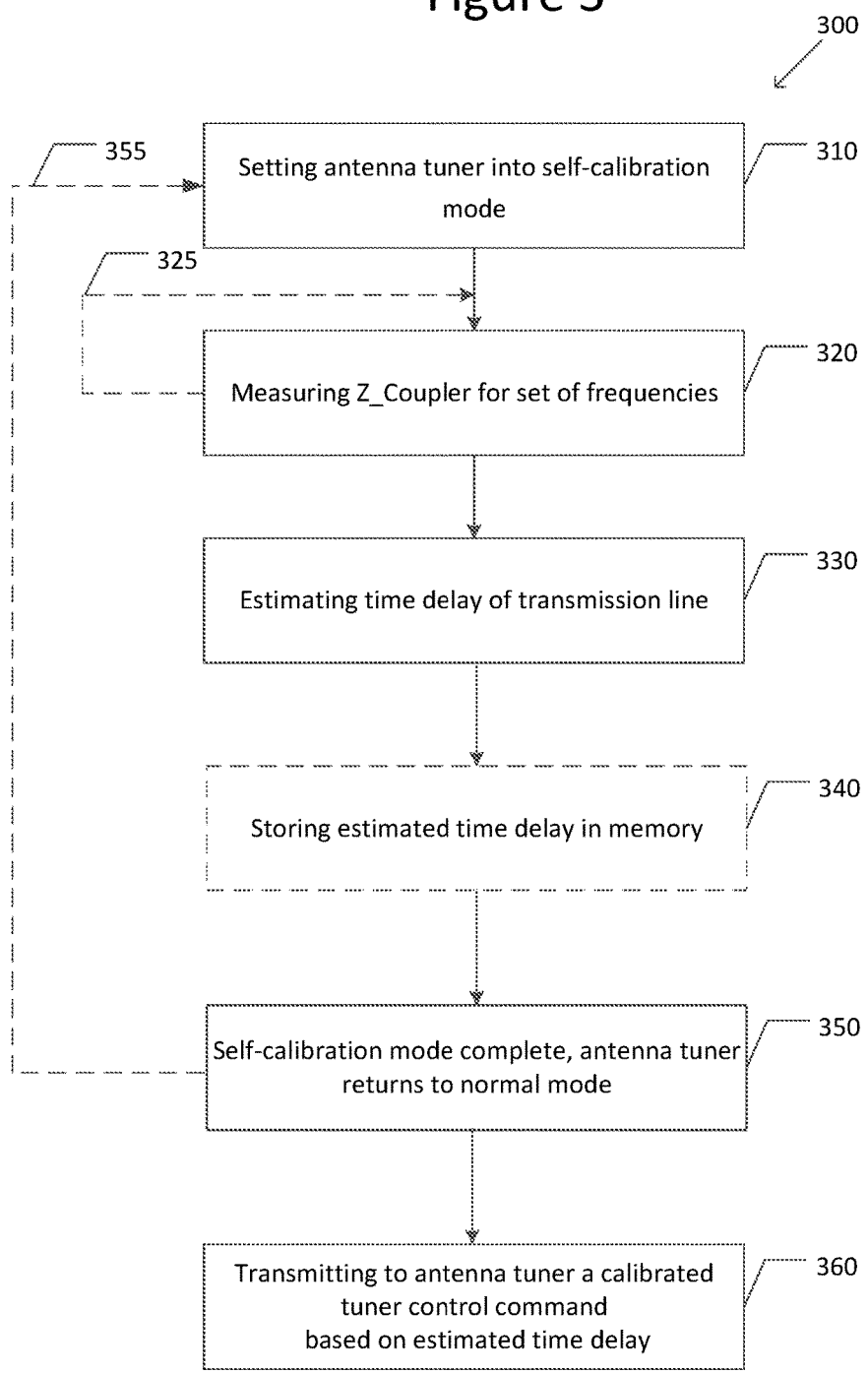

SELF-CALIBRATING ANTENNA SYSTEM

TECHNICAL FIELD

The present disclosure described herein generally relates to a self-calibrating antenna system, a wireless device having self-calibrating antenna system, and a method of self-calibrating an antenna system.

BACKGROUND

An antenna tuner is connected between a wireless device's radio frequency (RF) front end and antenna to improve power transfer by matching the impedance at the output of the RF front end, which is typically 50 ohms, to the antenna. For any non-50 ohm antenna impedance, the antenna tuner aims to transform the antenna impedance into a 50 ohm impedance at the input of the antenna tuner such that radiated power is maximized.

For this purpose, an antenna tuner is operated in a closed loop manner, using the wireless device's RF detector. This RF detector is configured to detect the impedance loaded at the output of the RF front end. When the characteristics of transmission lines between the RF front end and the antenna tuner are known, desired impedance at the input of the antenna tuner can be analytically calculated based on the impedance readout and the frequency of operation.

This closed loop approach requires precise knowledge of the transmission lines between the RF front end and the antenna tuner. In addition, immediate implementation of carrier aggregation requires multiplication of antenna modules, and accordingly, the number and complexity of transmission lines which connect the antenna modules to the RF front end in order to operate the antenna tuner.

From a product rollout perspective, this analytical approach requires significant interaction between manufacturers of the RF front end, antenna tuner, and transmission lines. Some manufacturers may not be willing to provide an accurate characterization of the transmission lines of the wireless device to be assembled. Transmission line calibration, which is required in order to operate the antenna tuner in a closed loop manner, is disadvantageous in actual practice.

BRIEF DESCRIPTION OF THE DRAWINGS

FIG. 3 is a flowchart illustrating an example of a method of self-calibrating an antenna system.

DETAILED DESCRIPTION

The present disclosure is directed to a self-calibrating antenna system having a radio frequency (RF) detector configured to estimate a time delay of a transmission signal on a transmission line, which couples an RF front end with an antenna tuner, based on a magnitude and phase of an input impedance of the transmission line at a first set of a plurality of respective frequencies, and a transceiver configured to transmit to the antenna tuner a calibrated tuning control command based on the estimated time delay to calibrate the antenna tuner and the transmission line.

The magnitude and phase of the input impedance of the transmission line enables an estimation of the electrical length of an equivalent transmission line between the RF front end and the antenna tuner, to thereby determine the antenna tuner's input impedance. The actual length of the transmission line does not need to be known. The antenna tuner and the transmission line may then be calibrated based on a shift in the phase of the input impedance, or in other words, based on the estimated time delay.

Figure 1:
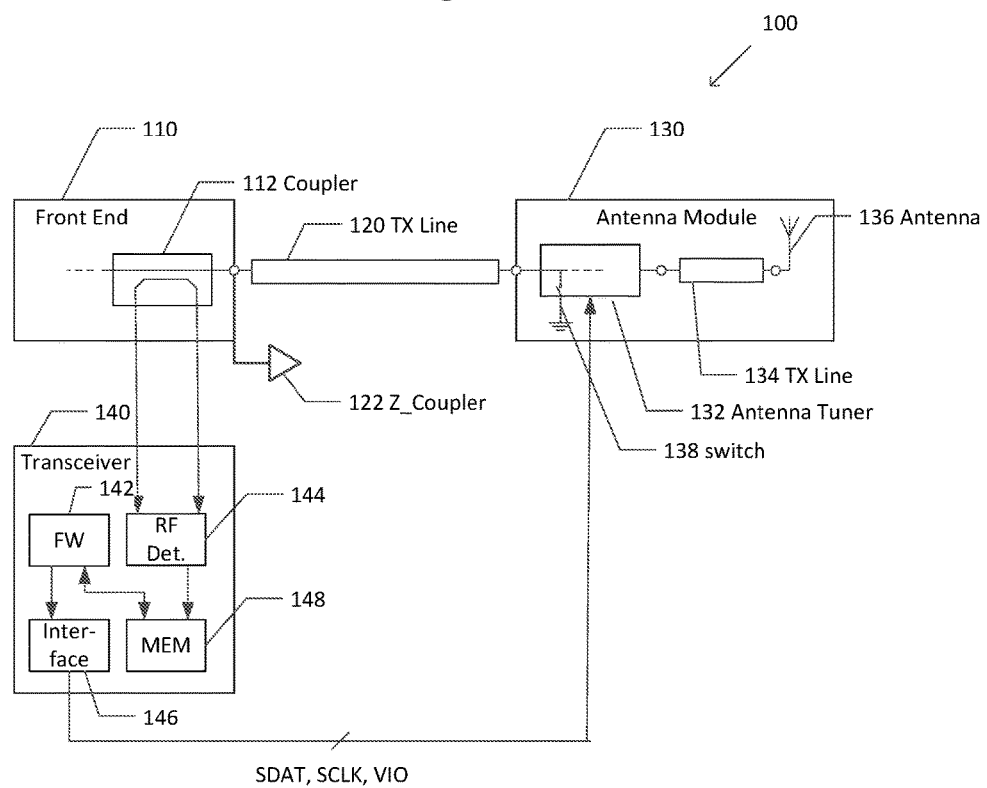
FIG. 1 illustrates a schematic diagram of an example of a self-calibrating antenna system.

FIG. 1 illustrates a schematic diagram of an example of a self-calibrating antenna system 100. Self-calibrating antenna system 100 comprises front end 110, transmission line 120, antenna module 130, and transceiver 140.

Front end 110 comprises coupler 112, which is configured to probe a fixed percentage of energy from forward and reflected waves on transmission line 120. "Front end" is a generic term for all circuitry between transmission line 120 and transceiver 140.

Antenna module 130 comprises antenna tuner 132, transmission line 134, and antenna 136. Antenna tuner 132 is configured to improve power transfer by matching the impedance at the output of RF front end 110 to the impedance of antenna 136.

Transceiver 140 comprises firmware 142, RF detector 144, interface 146, and memory 148. RF detector 144 is configured to estimate the input impedance of transmission line 120 based on the energy probed by coupler 112. This estimated impedance is also referred to as the coupler impedance, Z_Coupler 122. Interface 146 transmits to antenna tuner 132 data signal SDAT, clock signal SCLK, and enable signal VIO. This transmission by interface 146 is in response to instructions received from firmware 142. Memory 148 is configured to store an estimated time delay of transmission line 120, as described in detail further below. Memory 148 may be a non-volatile memory, and may also be a 16-bit register, however, the disclosure is not limited in these respects. The memory may be any known memory suitable for the intended purpose.

Firmware 142 may comprise a non-transitory computer-readable medium having stored thereon a computer program with a program code to be executed on a computer.

Figure 2:
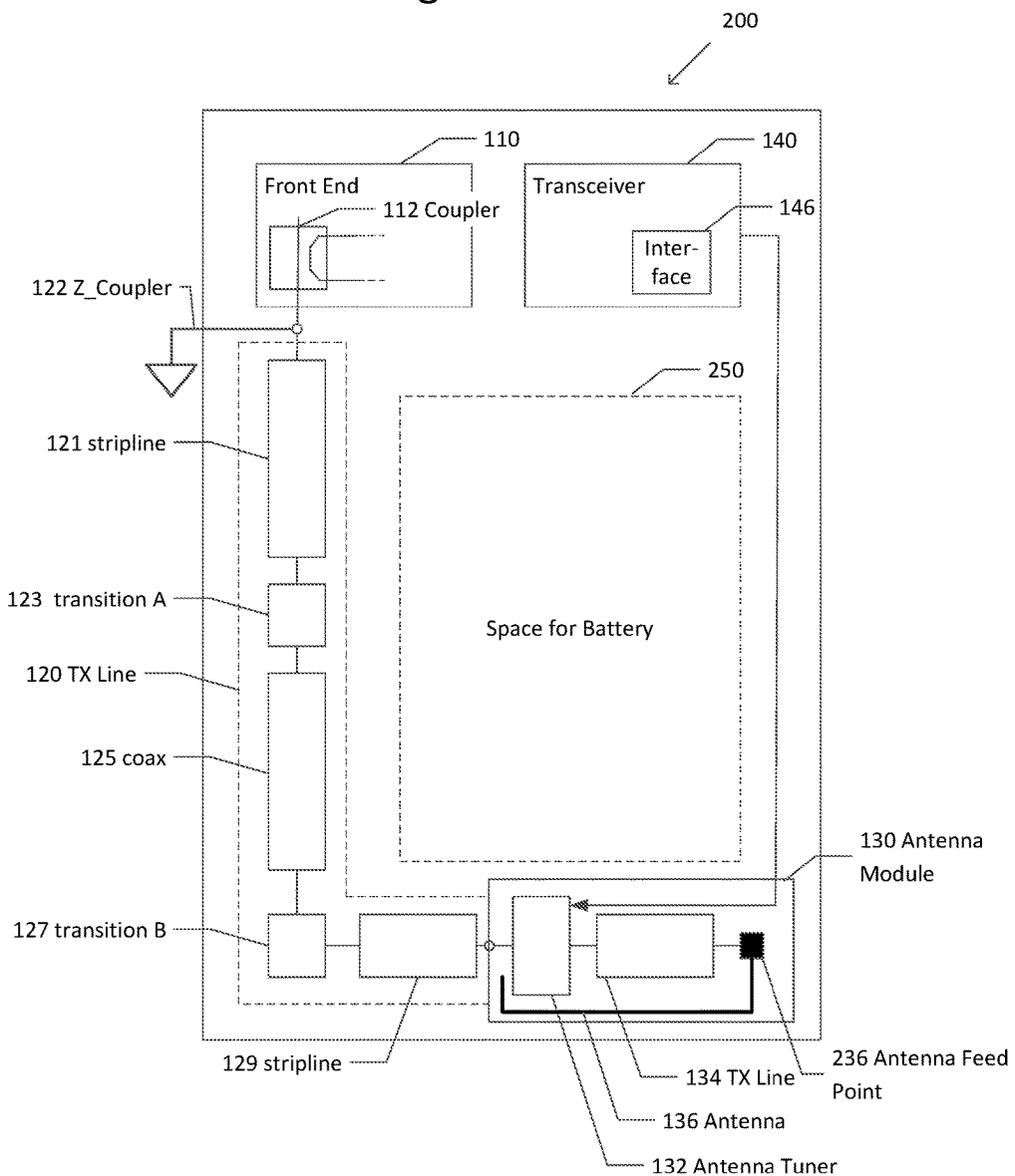
FIG. 2 illustrates a schematic diagram of an example of a wireless device comprising the self-calibrating antenna system of FIG. 1.

FIG. 2 illustrates a schematic diagram of wireless device 200 comprising the self-calibrating antenna system of FIG. 1. Wireless device 200 may be, for example, a smart phone, tablet, laptop, etc. Similar reference numerals shown in FIGS. 1 and 2 represent similar elements.

Device 200 comprises front end 110, transmission line 120, antenna module 130, and transceiver 140 as described above with respect to FIG. 1. Device 200 also includes a space 250 for a battery. Generic antenna 136 is shown together with antenna feed point 236 for connecting to transmission line 134. Transmission line 120 is shown in more detail than in FIG. 1 as comprising an exemplary sequence of components—stripline 121, transition A 123, coaxial cable 125, transition B 127, and stripline 129. Striplines 121 and 129 are RF transmission lines suitable for printed circuit boards (PCB). Transition A interconnects two different forms of transmission line—stripline 121 located in a PCB and coax 125 suspended in air. Coax 125 is an RF transmission line suitable for interconnecting two PCBs and configured to conduct an RF signal between stripline 121 in PCB and stripline 129 in another PCB. Transition B interconnects two different forms of transmission line—coax 125 suspended in air and stripline 129 located in a PCB.

FIG. 3 is a flowchart illustrating an example of a method of self-calibrating an antenna system 100.

At Step 310, firmware 142 instructs interface 146 to transmit to antenna tuner 132 a command to start a self-calibration mode, during which an input of antenna tuner 132 is set to be 0 ohms.

Next, at Step 320, a magnitude and phase of an input impedance of transmission line 120, represented as Z_Coupler, are measured by RF detector 144 at a first set of a plurality of respective frequencies. In order to obtain the time delay of interest, impedance measurements at at least two adjacent frequencies in this single set of a plurality of frequencies is required to derive the electrical length of an equivalent transmission line between RF coupler 112 of front end 110 and antenna tuner 132, and thus the antenna tuner's input impedance may be calculated. However, the disclosure is not limited in this respect; there may be any number of adjacent frequencies measured as suitable for the intended purpose. The greater number of frequencies measured, generally the greater the accuracy of the time delay estimate. Also, a difference or differences in frequency between the respective frequencies of the set may be chosen as required to achieve desired calibration accuracy.

The impedances are measured by coupler 112 probing a fixed percentage of power from both the forward and reflected waves and routing these two fractional waves to RF detector 144, which performs the actual measurement. RF detector 144 then uses these wave measurements to estimate the input impedance of transmission line 120, that is, Z_Coupler 122.

As is known, impedance relates univocally to reflection coefficient, given a fixed reference impedance. In order to measure this reflection coefficient, both the forward and the reflected waves, not just the reflected wave, should be measured. This is because the reflection coefficient is a complex fraction of a reflected wave relative to that of the incident wave. Knowing the differences in rotation and frequency, an estimation of the electrical length of an equivalent transmission line may be determined. The longer the transmission line 120, the greater the rotation (time delay). Also, the higher the frequency of the transmission on transmission line 120, the greater the rotation. This transmission line estimation is used to perform the calibration, or impedance transformation, by way of a reflection coefficient shift in phase, or compensation for time delay, which is simple to implement in firmware.

Optionally, Step 320 may be repeated for a second set of a plurality of respective frequencies, or as many additional sets of a plurality of respective frequencies as desired, as indicated by dotted-line arrow 325. Impedance measurements for each additional set of a plurality of frequencies beyond the first set results in more accurate estimations of the time delay of transmission line 120. As will be discussed in more detail below, an average of the time delays for the respective sets of frequencies is used as the estimated time delay for calibrating antenna tuner 132 and transmission line 120.

By way of example, assuming N sets of two adjacent frequencies are employed, and N=3, exemplary sets of a plurality of frequencies could be as follows:

Set A: 710 MHz and 910 MHz (represented in the equations below as f_a1 and f_a2, respectively)

Set B: 1710 MHz and 1760 MHz (represented in the equations below as f_b1 and f_b2, respectively)

Set C: 1910 MHz and 1960 MHz (represented in the equations below as f_c1 and f_c2, respectively)

The magnitude and phase of an input impedance of transmission line 120 are measured for each of the foregoing frequencies of sets A, B, and C and are represented as complex numbers. A complex number comprises real and imaginary components, where the real component represents the magnitude and the imaginary component represents the phase of the input impedance. There are 2*N complex impedances arranged in the N (N=3 in this case) sets of two frequencies.

Next, at Step 330, the time delay (TD) of transmission line 120 is estimated based on the transmission line input impedances that are measured by RF detector 144. More specifically, considering N=3, the time delay is estimated three times. The equations for estimating these times delays are represented as TD_a, TD_b and TD_c in Equations 1-3 as follows:

$$TD\_a=[(10^6/720)*(\arg\{Gamma(f\_a1)\}-\arg\{Gamma(f\_a2)\})/(f\_a2-f\_a1) \quad \text{(Equation 1)}$$

$$TD\_b=[(10^6/720)*(\arg\{Gamma(f\_b1)\}-\arg\{Gamma(f\_b2)\})/(f\_b2-f\_b1) \quad \text{(Equation 2)}$$

$$TD\_c=[(10^6/720)*(\arg\{Gamma(f\_c1)\}-\arg\{Gamma(f\_c2)\})/(f\_c2-f\_c1) \quad \text{(Equation 3)}$$

"TD" is a time delay magnitude generally expressed in picoseconds, "f" is a frequency value generally expressed in megahertz (MHz), though the disclosure is not limited to these measurement units. For any of the sets of two frequencies, "f_2" should be greater than "f_1". "Gamma(f)" is a reflection coefficient at frequency "f" corresponding to the transmission line input impedance Z_Coupler(f). Z_Coupler and Gamma relate as indicated in Equation 4 as follows:

$$Gamma=[Z\_Coupler-50]/[Z\_Coupler+50] \quad \text{(Equation 4)}$$

Considering that Z_Coupler is a complex number, Gamma is also a complex number. A feature of interest in Gamma is its phase in degrees, where it is preferable that 0 degrees<arg(Gamma)<360 degrees. If this is not the case, unwrapping of arg(Gamma) within a particular frequency set may be required. Unwrapping means subtracting 360 degrees from the arg(Gamma) for the Gamma at the highest frequency of the two frequencies of the set, that is, f_2. Unwrapping should be performed whenever for a particular set arg{Gamma(f_2)}>arg{Gamma(f_1)} and is calculated in Equation 5 as follows:

$$\text{Unwrap}\{\arg\{Gamma(f\_2)\}\}=\arg\{Gamma(f\_2)\}-360 \quad \text{(Equation 5)}$$

The final time delay which is used to calibrate antenna tuner 132 and transmission line 120 is an average of the N estimations, in this case three estimations, and is calculated using Equation 6 as follows:

$$TD=(TD\_a+TD\_b+TD\_c)/3 \quad \text{(Equation 6)}$$

At Step 340, optionally the estimated time delay TD may be stored in memory 148

At Step 350, the self-calibration mode is complete, and antenna tuner 132 returns to its normal, operational mode.

Optionally, Steps 310-350 may be repeated, such as on a periodic basis, as indicated by the dotted-line arrow 355.

Finally, at Step 360, firmware 142 instructs interface 146 of transceiver 140 to transmit to antenna tuner 132 a calibrated tuning control command based on the estimated time delay TD. More specifically, when enable signal VIO is high, interface 146 transmits to antenna tuner 132 in signal data SDAT a calibrated tuning control command synchronous with clock signal SCLK. Antenna tuner 132 and transmission line 120 are calibrated based on this calibrated tuner control command. This method described herein may be performed after manufacture of a device, such as a wireless device, comprising the antenna tuner and the transmission line. Alternatively, the method may be performed periodically. Another alternative is to perform the calibration after an event resulting in decalibration of the antenna tuner and the transmission line, such as after exposure to temperatures in a range of, for example, 35° C. or 40° C. or greater. Of course this calibration may be performed during any combination of these times.

If antenna tuner 132 does not have a calibration mode, this calibration method can still be performed manually by coupling the input of antenna tuner 132 with ground by closing switch 138. Step 310 of setting the antenna tuner 132 into self-calibration mode and Step 350 of returning antenna tuner 132 to normal mode would therefore be omitted. This option is particularly advantageous in test or factory prototypes during a manufacturing process.

The self-calibrating antenna system, wireless device having self-calibrating antenna control, and method of self-calibrating an antenna system as described herein are advantageous in many respects.

For instance, hardware change of the antenna tuner 132 and/or transmission lines 120 is not required. This solution is thus cost effective.

Since the electrical length of an equivalent transmission line between front end 110 and antenna tuner 132 is estimated, the actual characteristics of the transmission line are not required. This reduces the number of required interactions between the manufacturers of front end 110, transmission line 120, and antenna tuner 132.

Antenna system 100 is platform agnostic in that it does not require a specific antenna tuner 132 or transmission line 120 to be self-calibrated. If antenna tuner 132 itself does not have a self-calibration mode, the calibration can still be performed by coupling the input of antenna tuner 132 with ground. A wireless device manufacturer therefore has the freedom to choose components as convenient.

Antenna system 100 works for all frequencies of operation that the platform supports, for example, between 700 and 2,700 MHz, though the disclosure is not limited in this respect. Also, it can also be extended to diverse wireless device platforms, such as smart phones, tablets, laptops, etc.

Example 1 is a self-calibrating antenna system, comprising a radio frequency (RF) detector configured to estimate a time delay of a transmission signal on a transmission line, which couples an RF front end with an antenna tuner, based on a magnitude and phase of an input impedance of the transmission line at a first set of a plurality of respective frequencies; and a transceiver configured to transmit to the antenna tuner a calibrated tuning control command based on the estimated time delay to calibrate the antenna tuner and the transmission line.

In Example 2, the subject matter of Example 1 can optionally include a memory located in the transceiver and configured to store the estimated time delay.

In Example 3, the subject matter of Example 1 can optionally include that the RF detector is further configured to estimate the time delay of a transmission signal on the transmission line based on a magnitude and phase of an input impedance of the transmission line at a second set of a plurality of respective frequencies, and the estimated time delay for calibrating the antenna tuner and the transmission line is an average of the estimated time delay based on the first set of frequencies and the estimated time delay based on the second set of frequencies.

In Example 4, the subject matter of Example 1 can optionally include a coupler, located in the RF front end, and configured to direct a portion of energy of forward and reflected waves of the transmission signal from the transmission line to the RF detector.

In Example 5, the subject matter of Example 1 can optionally include that during calibration, an input impedance of the antenna tuner is set to 0 ohms.

In Example 6, the subject matter of Example 1 can optionally include that the calibrated tuning control command sets a magnitude of an output impedance of the transmission line to 50 ohms.

Example 7 is a wireless device comprising an antenna having an antenna port; and the self-calibrating antenna system of Example 1, coupled to the antenna port.

In Example 8, the subject matter of Example 7 can optionally include that the transceiver is configured to transmit the calibrated tuning control command to calibrate the antenna tuner and the transmission line periodically.

In Example 9, the subject matter of Example 7 can optionally include that the transceiver is configured to transmit the calibrated tuning control command to calibrate the antenna tuner and the transmission line after an event resulting in decalibration of the antenna tuner and the transmission line.

Example 10 is a method of self-calibrating an antenna system, the method comprising estimating, by a radio frequency (RF) detector, a time delay of a transmission signal on a transmission line, which couples an RF front end with an antenna tuner, based on a magnitude and phase of an input impedance of the transmission line at a first set of a plurality of respective frequencies; transmitting, by a transceiver, to the antenna tuner a calibrated tuning control command based on the estimated time delay; calibrating the antenna tuner and the transmission line based on the calibrated tuning control command.

In Example 11, the subject matter of Example 10 can optionally include coupling an input of the antenna tuner to ground.

In Example 12, the subject matter of Example 10 can optionally include storing the estimated time delay in a memory.

In Example 13, the subject matter of Example 10 can optionally include that the estimating step comprises measuring the magnitude and the phase of the input impedance of the transmission line at the first set of the plurality of respective frequencies.

In Example 14, the subject matter of Example 13 can optionally include measuring a magnitude and phase of an input impedance of the transmission line at a second set of a plurality of respective frequencies; and averaging the estimated time delay based on the first set of frequencies and the estimated time delay based on the second set of frequencies to result in the estimated time delay for calibrating the antenna tuner and the transmission line.

In Example 15, the subject matter of Example 10 can optionally include that the estimating, transmitting and calibrating steps are performed during manufacture of a wireless device comprising the antenna tuner and the transmission line.

In Example 16, the subject matter of Example 10 can optionally include that the method is performed after manufacture of a wireless device comprising the antenna tuner and the transmission line.

In Example 17, the subject matter of Example 10 can optionally include that the estimating, transmitting and calibrating steps are performed in a periodic time interval.

In Example 18, the subject matter of Example 10 can optionally include that the estimating, transmitting and calibrating steps are performed after an event resulting in decalibration of the antenna tuner and the transmission line.

In Example 19, the subject matter of Example 10 can optionally include that the estimating, transmitting and calibrating steps are performed at a time selected from the group consisting of during manufacture of the wireless device, after manufacture of the wireless device, in a periodic time interval, and after an event resulting in decalibration of the antenna tuner and the transmission line.

Example 20 is a non-transitory computer-readable medium having stored thereon a computer program with a program code for performing, when the program is executed on a computer, a method of self-calibrating an antenna system, the method comprising estimating a time delay of a transmission signal on a transmission line, which couples an RF front end with an antenna tuner, based on a magnitude and phase of an input impedance of the transmission line at a first set of a plurality of respective frequencies; transmitting to the antenna tuner a calibrated tuning control command based on the estimated time delay; and calibrating the antenna tuner and the transmission line based on the calibrated tuning control command.

In Example 21, the subject matter of Example 20 can optionally include that the estimating step comprises measuring the magnitude and the phase of the input impedance of the transmission line at the first set of the plurality of respective frequencies Example 22 is a self-calibrating antenna system, comprising a radio frequency (RF) detecting means for estimating a time delay of a transmission signal on a transmission line, which couples an RF front end with an antenna tuner, based on a magnitude and phase of an input impedance of the transmission line at a first set of a plurality of respective frequencies; and a transmitting means for transmitting to the antenna tuner a calibrated tuning control command based on the estimated time delay to calibrate the antenna tuner and the transmission line.

In Example 23, the subject matter of Example 22 can optionally include that the RF detecting means is further for estimating a time delay of a transmission signal on the transmission line based on a magnitude and phase of an input impedance of the transmission line at a second set of a plurality of respective frequencies, and the estimated time delay for calibrating the antenna tuner and the transmission line is an average of the estimated time delay based on the first set of frequencies and the estimated time delay based on the second set of frequencies.

In Example 24, the subject matter of any of Examples 1-2 can optionally include that the RF detector is further configured to estimate a time delay of a transmission signal on the transmission line based on a magnitude and phase of an input impedance of the transmission line at a second set of a plurality of respective frequencies, and the estimated time delay for calibrating the antenna tuner and the transmission line is an average of the estimated time delay based on the first set of frequencies and the estimated time delay based on the second set of frequencies.

In Example 25, the subject matter of any of Examples 1-3 can optionally include a coupler, located in the RF front end, and configured to direct a portion of energy of forward and reflected waves of the transmission signal from the transmission line to the RF detector.

In Example 26, the subject matter of any of Examples 1-4 can optionally include that during calibration, an input impedance of the antenna tuner is set to 0 ohms.

In Example 27, the subject matter of any of Examples 1-5 can optionally include that the calibrated tuning control command sets a magnitude of an output impedance of the transmission line to 50 ohms.

Example 28 is a wireless device comprising an antenna having an antenna port; and the self-calibrating antenna system of any of Examples 1-6, coupled to the antenna port.

In Example 29, the subject matter of Example 30 can optionally include that the antenna tuner and the transmission line are calibrated during manufacture of the wireless device.

In Example 30, the subject matter of Example 28 can optionally include that the antenna tuner and the transmission line are calibrated after manufacture of the wireless device.

In Example 31, the subject matter of any of Examples 10-11 can optionally include storing the estimated time delay in a memory.

In Example 32, the subject matter of any of Examples 10-12 can optionally include that the estimating step comprises measuring the magnitude and the phase of the input impedance of the transmission line at the first set of the plurality of respective frequencies.

In Example 33, the subject matter of Example 32 can optionally include that the estimating step further comprises: measuring a magnitude and phase of an input impedance of the transmission line at a second set of a plurality of respective frequencies; and averaging the estimated time delay based on the first set of frequencies and the estimated time delay based on the second set of frequencies to result in the estimated time delay for calibrating the antenna tuner and the transmission line.

In Example 34, the subject matter of any of Examples 10-14 can optionally include that the estimating, transmitting and calibrating steps are performed during manufacture of a wireless device comprising the antenna tuner and the transmission line.

In Example 35, the subject matter of any of Examples 10-14 can optionally include that the estimating, transmitting and calibrating steps are performed after manufacture of a wireless device comprising the antenna tuner and the transmission line.

In Example 36, the subject matter of any of Examples 10-14 can optionally include that the estimating, transmitting and calibrating steps are performed in a periodic interval.

In Example 37, the subject matter of any of Examples 10-14 can optionally include that the estimating, transmitting and calibrating steps are performed after an event resulting in decalibration of the antenna tuner and the transmission line.

In Example 38, the subject matter of any of Examples 10-14 can optionally include that the estimating, transmitting and calibrating steps are performed at a time selected from the group consisting of during manufacture of the wireless device, after manufacture of the wireless device, in a periodic interval, and after an event resulting in decalibration of the antenna tuner and the transmission line.

Example 39 is an apparatus substantially as shown and described.

Example 40 is a method substantially as shown and described.

While the foregoing has been described in conjunction with examples, it is understood that the term "example" is not meant as the best or optimal. Accordingly, the disclosure is intended to cover alternatives, modifications and equivalents, which may be included within the scope of the disclosure.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein.

The invention claimed is:

1. A self-calibrating antenna system, comprising:
a radio frequency (RF) detector configured to estimate a time delay of a transmission signal on a transmission line, which couples an RF front end with an antenna tuner, based on a magnitude and phase of an input impedance of the transmission line at a first set of a plurality of respective frequencies; and
a processor configured to transmit to the antenna tuner within signal data a calibrated tuning control command synchronous with a clock signal and based on the estimated time delay to calibrate the antenna tuner and the transmission line.

2. The self-calibrating antenna system of claim 1, further comprising a memory located in the processor and configured to store the estimated time delay.

3. The self-calibrating antenna system of claim 1,
wherein the RF detector is further configured to estimate the time delay of a transmission signal on the transmission line based on a magnitude and phase of an input impedance of the transmission line at a second set of a plurality of respective frequencies, and
wherein the estimated time delay for calibrating the antenna tuner and the transmission line is an average of the estimated time delay based on the first set of frequencies and the estimated time delay based on the second set of frequencies.

4. The self-calibrating antenna system of claim 1, further comprising:
a coupler, located in the RF front end, and configured to direct a portion of energy of forward and reflected waves of the transmission signal from the transmission line to the RF detector.

5. The self-calibrating antenna system of claim 1, wherein during calibration, an input impedance of the antenna tuner is set to 0 ohms.

6. The self-calibrating antenna system of claim 1, wherein the calibrated tuning control command sets a magnitude of an output impedance of the transmission line to 50 ohms.

7. A wireless device comprising:
an antenna having an antenna port; and
the self-calibrating antenna system of claim 1, coupled to the antenna port.

8. The wireless device of claim 7, wherein the processor is configured to transmit the calibrated tuning control command to calibrate the antenna tuner and the transmission line periodically.

9. The wireless device of claim 7, wherein the processor is configured to transmit the calibrated tuning control command to calibrate the antenna tuner and the transmission line after an event resulting in decalibration of the antenna tuner and the transmission line.

10. A method of self-calibrating an antenna system, the method comprising:
estimating, by a radio frequency (RF) detector, a time delay of a transmission signal on a transmission line, which couples an RF front end with an antenna tuner, based on a magnitude and phase of an input impedance of the transmission line at a first set of a plurality of respective frequencies;
transmitting, by a processor, to the antenna tuner within signal data a calibrated tuning control command synchronous with a clock signal and based on the estimated time delay; and
calibrating the antenna tuner and the transmission line based on the calibrated tuning control command.

11. The method of claim 10, further comprising:
coupling an input of the antenna tuner to ground.

12. The method of claim 10, further comprising:
storing the estimated time delay in a memory.

13. The method of claim 10, wherein the estimating step comprises measuring the magnitude and the phase of the input impedance of the transmission line at the first set of the plurality of respective frequencies.

14. The method of claim 13, wherein the estimating step further comprises:
measuring a magnitude and phase of an input impedance of the transmission line at a second set of a plurality of respective frequencies; and
averaging the estimated time delay based on the first set of frequencies and the estimated time delay based on the second set of frequencies to result in the estimated time delay for calibrating the antenna tuner and the transmission line.

15. The method of claim 10, wherein the estimating, transmitting and calibrating steps are performed during manufacture of a wireless device comprising the antenna tuner and the transmission line.

16. The method of claim 10, wherein the method is performed after manufacture of a wireless device comprising the antenna tuner and the transmission line.

17. The method of claim 10, wherein the estimating, transmitting and calibrating steps are performed in a periodic time interval.

18. The method of claim 10, wherein the estimating, transmitting and calibrating steps are performed after an event resulting in decalibration of the antenna tuner and the transmission line.

19. The method of claim 10, wherein the estimating, transmitting and calibrating steps are performed at a time selected from the group consisting of during manufacture of the wireless device, after manufacture of the wireless device, in a periodic time interval, and after an event resulting in decalibration of the antenna tuner and the transmission line.

20. A non-transitory computer-readable medium having stored thereon a computer program with a program code for performing, when the program is executed on a computer, a method of self-calibrating an antenna system, the method comprising:
estimating, by a radio frequency (RF) detector, a time delay of a transmission signal on a transmission line, which couples an RF front end with an antenna tuner, based on a magnitude and phase of an input impedance of the transmission line at a first set of a plurality of respective frequencies;
transmitting, by a processor, to the antenna tuner within signal data a calibrated tuning control command synchronous with a clock signal and based on the estimated time delay; and
calibrating the antenna tuner and the transmission line based on the calibrated tuning control command.

21. The non-transitory computer-readable medium of claim 20, wherein the estimating step comprises measuring the magnitude and the phase of the input impedance of the transmission line at the first set of the plurality of respective frequencies.

\* \* \* \* \*